United States Patent
Islinger

(10) Patent No.: US 9,583,253 B2
(45) Date of Patent: Feb. 28, 2017

(54) ELECTRIC VEHICLE INDUCTION COIL HOUSING WITH INTERENGAGEMENT STRUCTURE FOR FERRITE TILE ASSEMBLIES

(71) Applicant: QUALCOMM INCORPORATED, San Diego, CA (US)

(72) Inventor: Simon Peter Islinger, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 184 days.

(21) Appl. No.: 14/203,289

(22) Filed: Mar. 10, 2014

(65) Prior Publication Data

US 2015/0255205 A1    Sep. 10, 2015

(51) Int. Cl.
| | |
|---|---|
| H01F 27/02 | (2006.01) |
| H02J 7/00 | (2006.01) |
| H01F 27/26 | (2006.01) |
| B60L 11/18 | (2006.01) |
| H05K 5/02 | (2006.01) |
| H02J 5/00 | (2016.01) |
| H01F 38/14 | (2006.01) |
| H01F 41/00 | (2006.01) |
| H01F 41/04 | (2006.01) |

(52) U.S. Cl.
CPC .......... H01F 27/266 (2013.01); B60L 11/182 (2013.01); H01F 38/14 (2013.01); H01F 41/005 (2013.01); H01F 41/04 (2013.01); H02J 5/005 (2013.01); H05K 5/0217 (2013.01); Y10T 29/4902 (2015.01)

(58) Field of Classification Search
CPC .................................................... H01F 27/266

USPC ..................................................... 336/192, 92
See application file for complete search history.

(56) References Cited

U.S. PATENT DOCUMENTS

| | | | |
|---|---|---|---|
| 3,840,795 A | 10/1974 | Roszyk et al. | |
| 4,641,370 A | 2/1987 | Oyamada | |
| 5,821,845 A * | 10/1998 | Ohashi | ................ H01F 17/06 333/1 |
| 7,411,565 B2 | 8/2008 | McKinzie et al. | |
| 2005/0140255 A1 | 6/2005 | Wilson | |
| 2012/0025602 A1 | 2/2012 | Boys et al. | |

(Continued)

FOREIGN PATENT DOCUMENTS

| | | |
|---|---|---|
| DE | 102011106027 A1 | 1/2013 |
| WO | WO-2014096035 A1 | 6/2014 |

OTHER PUBLICATIONS

US 7,554,799, 06/2009, Cargin, Jr. et al. (withdrawn)

(Continued)

*Primary Examiner* — Mangtin Lian
*Assistant Examiner* — Ronald Hinson
(74) *Attorney, Agent, or Firm* — Knobbe, Martens, Olson & Bear, LLP

(57) ABSTRACT

Systems and methods for implementing interengagement structures for a ferrite tile assembly of an induction coil housing are described herein. One aspect of the subject matter described in the disclosure is a housing. The housing includes a base forming a receptacle. The housing further includes a ferrite tile assembly. The housing further includes an interengagement structure extending from the base and configured to secure the ferrite tile assembly relative to the base within the receptacle.

17 Claims, 13 Drawing Sheets

(56) References Cited

U.S. PATENT DOCUMENTS

2013/0135072 A1* 5/2013 Inaba ..................... H01F 27/23
336/90
2013/0249477 A1 9/2013 Keeling et al.

OTHER PUBLICATIONS

English translation of DE102011106027.*
International Search Report—PCT/US2015/017121—ISA/EPO—May 29, 2015.

* cited by examiner

US 9,583,253 B2

ELECTRIC VEHICLE INDUCTION COIL HOUSING WITH INTERENGAGEMENT STRUCTURE FOR FERRITE TILE ASSEMBLIES

FIELD

The present disclosure relates generally to wireless power transfer, and more specifically to devices, systems, and methods related to wireless power transfer to remote systems such as electric vehicles, and in particular to interengagement structures for a ferrite tile assembly of an induction coil housing.

BACKGROUND

Remote systems, such as vehicles, have been introduced that include locomotion power derived from electricity received from an energy storage device such as a battery. For example, hybrid electric vehicles include on-board chargers that use power from vehicle braking and traditional motors to charge the vehicles. Vehicles that are solely electric generally receive the electricity for charging the batteries from other sources. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (e.g., via a wireless field) to be used to charge electric vehicles may overcome some of the deficiencies of wired charging solutions. As such, wireless charging systems and methods that efficiently and safely transfer power for charging electric vehicles are desirable.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the subject matter described in the disclosure is an induction coil housing. The induction coil housing includes a base forming a receptacle. The induction coil housing further includes an interengagement structure extending from the base and configured to secure a ferrite tile assembly relative to the base within the receptacle.

Another aspect of the subject matter described in the disclosure is a method for securing a ferrite tile assembly within a base of an induction coil housing. The method includes providing a base forming a receptacle and having an interengagement structure. The interengagement structure extends from the base within the receptacle. The method further includes placing a ferrite tile assembly within the receptacle. The method further includes contacting at least a portion of the ferrite tile assembly with the interengagement structure so as to inhibit movement of the ferrite tile assembly in at least one direction relative to the base.

Another aspect of the subject matter described in the disclosure is an induction coil housing. The induction coil housing includes a base forming a receptacle. The induction coil housing also includes means for securing an upper surface of a ferrite tile assembly within the receptacle of the base. The induction coil housing also includes means for securing a lower surface of the ferrite tile assembly within the receptacle of the base. The induction coil housing also includes means for securing a side surface of the ferrite tile assembly within the receptacle of the base.

Figure 1:
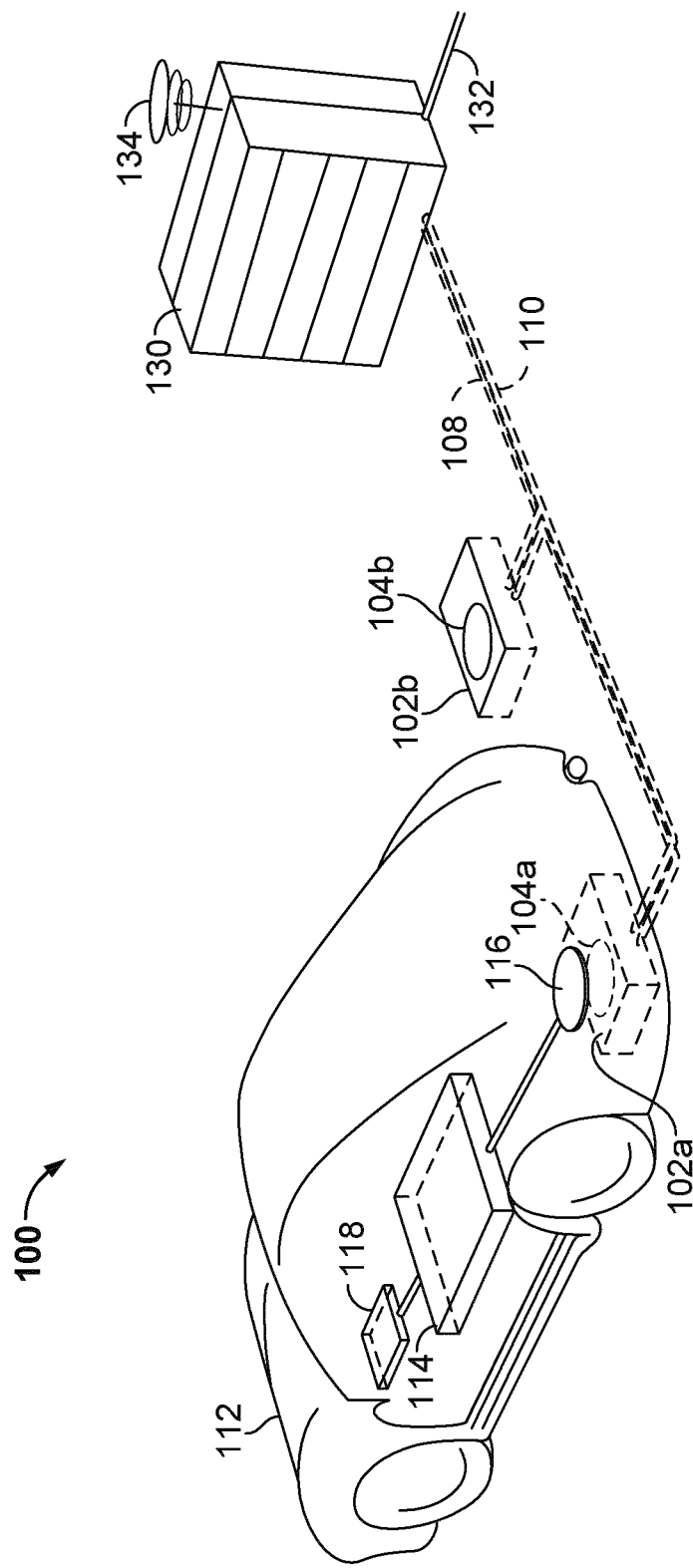
FIG. 1 is a diagram of an exemplary wireless power transfer system for charging an electric vehicle, in accordance with an exemplary embodiment.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments and is not intended to represent the only embodiments which may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. In some instances, some devices are shown in block diagram form.

The detailed description set forth below in connection with the appended drawings is intended as a description of exemplary embodiments and is not intended to represent the only embodiments in which embodiments may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like).

FIG. 1 is a diagram of an exemplary wireless power transfer system 100 for charging an electric vehicle 112, in accordance with an exemplary embodiment. The wireless power transfer system 100 enables charging of an electric vehicle 112 while the electric vehicle 112 is parked near a base wireless charging system 102a. Spaces for two electric vehicles are illustrated in a parking area to be parked over corresponding base wireless charging system 102a and 102b. In some embodiments, a local distribution center 130 may be connected to a power backbone 132 and configured to provide an alternating current (AC) or a direct current (DC) supply through a power link 110 to the base wireless charging system 102a. The base wireless charging system 102a also includes a base system induction coil 104a for wirelessly transferring or receiving power. An electric vehicle 112 may include a battery unit 118, an electric vehicle induction coil 116, and an electric vehicle wireless charging system 114. The electric vehicle induction coil 116 may interact with the base system induction coil 104a for example, via a region of the electromagnetic field generated by the base system induction coil 104a. In certain embodiments, the electric vehicle induction coil can be disposed within an induction coil housing (not illustrated in FIG. 1).

In some exemplary embodiments, the electric vehicle induction coil 116 may receive power when the electric vehicle induction coil 116 is located in an energy field produced by the base system induction coil 104a. The field corresponds to a region where energy output by the base system induction coil 104a may be captured by an electric vehicle induction coil 116. For example, the energy output by the base system induction coil 104a may be at a level sufficient to charge or power the electric vehicle 112. In some cases, the field may correspond to the "near field" of the base system induction coil 104a. The near-field may correspond to a region in which there are strong reactive fields resulting from the currents and charges in the base system induction coil 104a that do not radiate power away from the base system induction coil 104a. In some cases the near-field may correspond to a region that is within about ½π of wavelength of the base system induction coil 104a (and vice versa for the electric vehicle induction coil 116).

Local distribution center 130 may be configured to communicate with external sources (e.g., a power grid) via a communication backhaul 134, and with the base wireless charging system 102a via a communication link 108.

In some embodiments the electric vehicle induction coil 116 may be aligned with the base system induction coil 104a and, therefore, disposed within a near-field region simply by the driver positioning the electric vehicle 112 correctly relative to the base system induction coil 104a. In other embodiments, the driver may be given visual feedback, auditory feedback, or combinations thereof to determine when the electric vehicle 112 is properly placed for wireless power transfer. In yet other embodiments, the electric vehicle 112 may be positioned by an autopilot system, which may move the electric vehicle 112 back and forth (e.g., in zig-zag movements) until an alignment error has reached a tolerable value. This may be performed automatically and autonomously by the electric vehicle 112 without or with only minimal driver intervention provided that the electric vehicle 112 is equipped with a servo steering wheel, ultrasonic sensors, and intelligence to adjust the vehicle. In still other embodiments, the electric vehicle induction coil 116, the base system induction coil 104a, or a combination thereof may have functionality for displacing and moving the induction coils 116 and 104a relative to each other to more accurately orient them and develop more efficient coupling there between.

The base wireless charging system 102a may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may also be no exposed electrical contacts and no mechanical wear out, thereby improving reliability of the wireless power transfer system 100. Manipulations with cables and connectors may not be needed, and there may be no cables, plugs, or sockets that may be exposed to moisture and water in an outdoor environment, thereby improving safety. There may also be no sockets, cables, and plugs visible or accessible, thereby reducing potential vandalism of power charging devices. Further, since an electric vehicle 112 may be used as distributed storage devices to stabilize a power grid, a docking-to-grid solution may be used to increase availability of vehicles for Vehicle-to-Grid (V2G) operation.

A wireless power transfer system 100 as described with reference to FIG. 1 may also provide aesthetical and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102a transfers power to the electric vehicle 112 and the electric vehicle 112 transfers power to the base wireless charging system 102a e.g., in times of energy shortfall. This capability may be useful to stabilize the power distribution grid by allowing electric vehicles to contribute power to the overall distribution system in times of energy shortfall caused by over demand or shortfall in renewable energy production (e.g., wind or solar).

Figure 2:
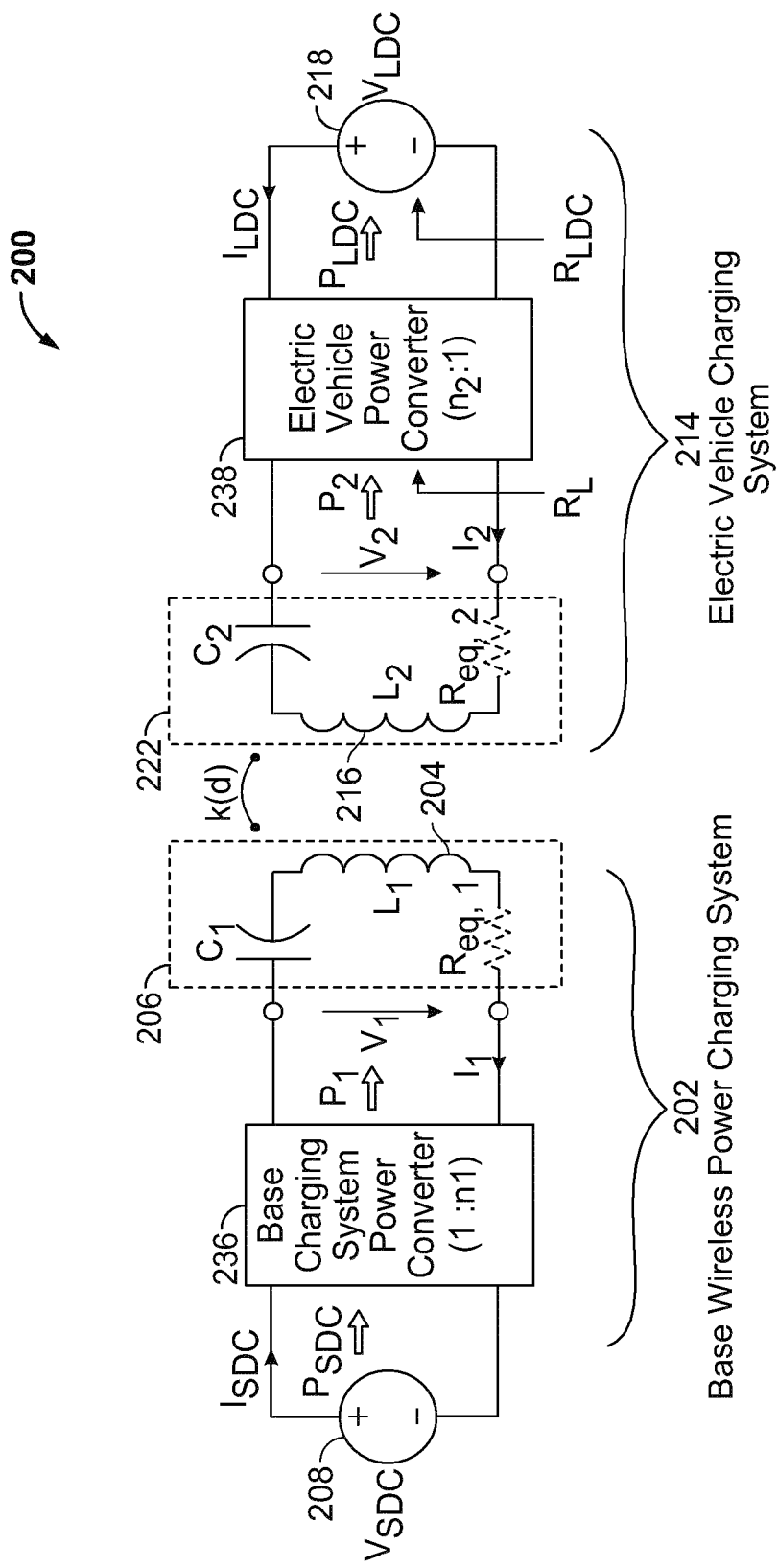
FIG. 2 is a schematic diagram of exemplary core components of the wireless power transfer system of FIG. 1 in accordance with an exemplary embodiment.

FIG. 2 is a schematic diagram of exemplary core components of the wireless power transfer system 100 of FIG. 1. As shown in FIG. 2, the wireless power transfer system 200 may include a base system transmit circuit 206 including a base system induction coil 204 having an inductance $L_1$. The wireless power transfer system 200 further includes an electric vehicle receive circuit 222 including an electric vehicle induction coil 216 having an inductance $L_2$. Embodiments described herein may use capacitively loaded wire loops (i.e., multi-turn coils) forming a resonant structure that is capable of efficiently coupling energy from a primary structure (transmitter) to a secondary structure (receiver) via a magnetic or electromagnetic near field if both primary and secondary are tuned to a common resonant frequency. The coils may be used for the electric vehicle induction coil 216 and the base system induction coil 204. Using resonant structures for coupling energy may be referred to "magnetic coupled resonance," "electromagnetic coupled resonance," and/or "resonant induction." The operation of the wireless power transfer system 200 will be described based on power transfer from a base wireless power charging system 202 to an electric vehicle 112, but is not limited thereto. For example, as discussed above, the electric vehicle 112 may transfer power to the base wireless charging system 102a.

With reference to FIG. 2, a power supply 208 (e.g., AC or DC) supplies power $P_{SDC}$ to the base wireless power charging system 202 to transfer energy to the electric vehicle 112. The base wireless power charging system 202 includes a base charging system power converter 236. The base charging system power converter 236 may include circuitry such as an AC/DC converter configured to convert power from standard mains AC to DC power at a suitable voltage level, and a DC/low frequency (LF) converter configured to convert DC power to power at an operating frequency suitable for wireless high power transfer. The base charging system power converter 236 supplies power $P_1$ to the base system transmit circuit 206 including the capacitor $C_1$ in series with the base system induction coil 204 to emit an electromagnetic field at a desired frequency. The capacitor $C_1$ may be provided to form a resonant circuit with the base system induction coil 204 that resonates at a desired frequency. The base system induction coil 204 receives the power $P_1$ and wirelessly transmits power at a level sufficient to charge or power the electric vehicle 112. For example, the power level provided wirelessly by the base system induction coil 204 may be on the order of kilowatts (kW) (e.g., anywhere from 1 kW to 110 kW or higher or lower).

The base system transmit circuit 206 including the base system induction coil 204 and electric vehicle receive circuit 222 including the electric vehicle induction coil 216 may be tuned to substantially the same frequencies and may be positioned within the near-field of an electromagnetic field transmitted by one of the base system induction coil 204 and the electric vehicle induction coil 216. In this case, the base system induction coil 204 and electric vehicle induction coil 216 may become coupled to one another such that power may be transferred to the electric vehicle receive circuit 222 including capacitor $C_2$ and electric vehicle induction coil 216. The capacitor $C_2$ may be provided to form a resonant circuit with the electric vehicle induction coil 216 that resonates at a desired frequency. Element k(d) represents the mutual coupling coefficient resulting at coil separation. Equivalent resistances $R_{eq,1}$ and $R_{eq,2}$ represent the losses that may be inherent to the induction coils 204 and 216 and the anti-reactance capacitors $C_1$ and $C_2$. The electric vehicle receive circuit 222 including the electric vehicle induction coil 316 and capacitor $C_2$ receives power $P_2$ and provides the power $P_2$ to an electric vehicle power converter 238 of an electric vehicle charging system 214.

The electric vehicle power converter 238 may include, among other things, a LF/DC converter configured to convert power at an operating frequency back to DC power at a voltage level matched to the voltage level of an electric vehicle battery unit 218. The electric vehicle power converter 238 may provide the converted power $P_{LDC}$ to charge the electric vehicle battery unit 218. The power supply 208, base charging system power converter 236, and base system induction coil 204 may be stationary and located at a variety of locations as discussed above. The battery unit 218, electric vehicle power converter 238, and electric vehicle induction coil 216 may be included in an electric vehicle charging system 214 that is part of electric vehicle 112 or part of the battery pack (not shown). The electric vehicle charging system 214 may also be configured to provide power wirelessly through the electric vehicle induction coil 216 to the base wireless power charging system 202 to feed power back to the grid. Each of the electric vehicle induction coil 216 and the base system induction coil 204 may act as transmit or receive induction coils based on the mode of operation.

While not shown, the wireless power transfer system 200 may include a load disconnect unit (LDU) to safely disconnect the electric vehicle battery unit 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle induction coil 216 to the electric vehicle power converter 238. Disconnecting the electric vehicle induction coil 216 may suspend charging and also may adjust the "load" as "seen" by the base wireless charging system 102a (acting as a transmitter), which may be used to "cloak" the electric vehicle charging system 114 (acting as the receiver) from the base wireless charging system 102a. The load changes may be detected if the transmitter includes the load sensing circuit. Accordingly, the transmitter, such as a base wireless charging system 202, may have a mechanism for determining when receivers, such as an electric vehicle charging system 114, are present in the near-field of the base system induction coil 204.

As described above, in operation, assuming energy transfer towards the vehicle or battery, input power is provided from the power supply 208 such that the base system induction coil 204 generates a field for providing the energy transfer. The electric vehicle induction coil 216 couples to the radiated field and generates output power for storage or consumption by the electric vehicle 112. As described above, in some embodiments, the base system induction coil 204 and electric vehicle induction coil 216 are configured according to a mutual resonant relationship such that the resonant frequency of the electric vehicle induction coil 216 and the resonant frequency of the base system induction coil 204 are very close or substantially the same. Transmission losses between the base wireless power charging system 202 and electric vehicle charging system 214 are minimal when the electric vehicle induction coil 216 is located in the near-field of the base system induction coil 204.

As stated, an efficient energy transfer occurs by coupling a large portion of the energy in the near field of a transmitting induction coil to a receiving induction coil rather than propagating most of the energy in an electromagnetic wave to the far-field. When in the near field, a coupling mode may be established between the transmit induction coil and the receive induction coil. The area around the induction coils where this near field coupling may occur is referred to herein as a near field coupling mode region.

While not shown, the base charging system power converter 236 and the electric vehicle power converter 238 may both include an oscillator, a driver circuit such as a power amplifier, a filter, and a matching circuit for efficient coupling with the wireless power induction coil. The oscillator may be configured to generate a desired frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance of the power conversion module to the wireless power induction coil. The power converters 236 and 238 may also include a rectifier and switching circuitry to generate a suitable power output to charge the battery.

The electric vehicle induction coil 216 and base system induction coil 204 as described throughout the disclosed embodiments may be referred to or configured as "loop" antennas, and more specifically, multi-turn loop antennas. The induction coils 204 and 216 may also be referred to herein or be configured as "magnetic" antennas. The term "coil" generally refers to a component that may wirelessly output or receive energy four coupling to another "coil." The coil may also be referred to as an "antenna" of a type that is configured to wirelessly output or receive power. As used herein, coils 204 and 216 are examples of "power transfer components" of a type that are configured to wirelessly output, wirelessly receive, and/or wirelessly relay power. Loop (e.g., multi-turn loop) antennas may be configured to include an air core or a physical core such as a ferrite core. An air core loop antenna may allow the placement of other components within the core area. Physical core antennas including ferromagnetic or ferromagnetic materials may allow development of a stronger electromagnetic field and improved coupling.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency. Transfer of energy occurs by coupling energy from the near field of the transmitting induction coil to the receiving induction coil residing within a region (e.g., within a predetermined frequency range of the resonant frequency, or within a predetermined distance of the near-field region) where this near field is established rather than propagating the energy from the transmitting induction coil into free space.

A resonant frequency may be based on the inductance and capacitance of a transmit circuit including an induction coil (e.g., the base system induction coil 204) as described above. As shown in FIG. 2, inductance may generally be the inductance of the induction coil, whereas, capacitance may be added to the induction coil to create a resonant structure at a desired resonant frequency. As a non-limiting example, as shown in FIG. 2, a capacitor may be added in series with the induction coil to create a resonant circuit (e.g., the base system transmit circuit 206) that generates an electromagnetic field. Accordingly, for larger diameter induction coils, the value of capacitance needed to induce resonance may decrease as the diameter or inductance of the coil increases. Inductance may also depend on a number of turns of an induction coil. Furthermore, as the diameter of the induction coil increases, the efficient energy transfer area of the near field may increase. Other resonant circuits are possible. As another non limiting example, a capacitor may be placed in parallel between the two terminals of the induction coil (e.g., a parallel resonant circuit). Furthermore an induction coil may be designed to have a high quality (Q) factor to improve the resonance of the induction coil. For example, the Q factor may be 300 or greater.

As described above, according to some embodiments, coupling power between two induction coils that are in the near field of one another is disclosed. As described above, the near field may correspond to a region around the induction coil in which electromagnetic fields exist but may not propagate or radiate away from the induction coil. Near-field coupling-mode regions may correspond to a volume that is near the physical volume of the induction coil, typically within a small fraction of the wavelength. According to some embodiments, electromagnetic induction coils, such as single and multi-turn loop antennas, are used for both transmitting and receiving since magnetic near field amplitudes in practical embodiments tend to be higher for magnetic type coils in comparison to the electric near fields of an electric type antenna (e.g., a small dipole). This allows for potentially higher coupling between the pair. Furthermore, "electric" antennas (e.g., dipoles and monopoles) or a combination of magnetic and electric antennas may be used.

Figure 3:
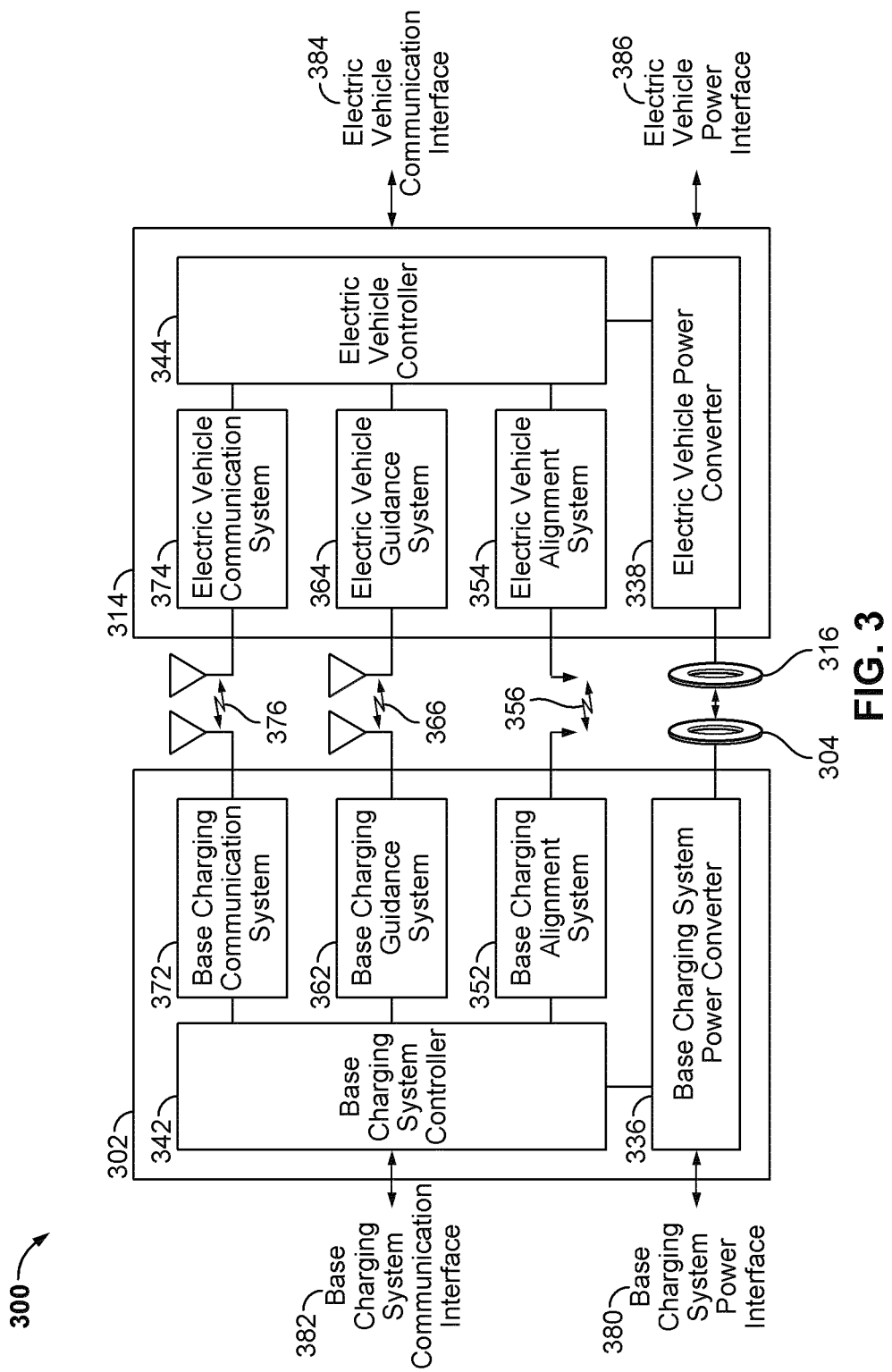
FIG. 3 is a diagram showing exemplary core and ancillary components of the wireless power transfer system of FIG. 1.

FIG. 3 is a diagram showing exemplary core and ancillary components of the wireless power transfer system 300 of FIG. 1. The wireless power transfer system 300 illustrates a communication link 376, a guidance link 366, and alignment system link 356 between base charging alignment system 352 and electric vehicle alignment system 354 for the base system induction coil 304 and electric vehicle induction coil 316. As described above with reference to FIG. 2, and assuming energy flow towards the electric vehicle 112, in FIG. 3 a base charging system power interface 380 may be configured to provide power to a charging system power converter 336 from a power source, such as an AC or DC power supply (not illustrated). The base charging system power converter 336 may receive AC or DC power from the base charging system power interface 380 to excite the base system induction coil 304 at or near its resonant frequency. The electric vehicle induction coil 316, when in the near field coupling-mode region, may receive energy from the near field coupling mode region to oscillate at or near the resonant frequency. The electric vehicle power converter 338 converts the oscillating signal from the electric vehicle induction coil 316 to a power signal suitable for charging a battery via the electric vehicle power interface.

The base wireless charging system 302 includes a base charging system controller 342 and the electric vehicle charging system 314 includes an electric vehicle controller 344. The base charging system controller 342 may communicate via a base charging system communication interface 382 to other systems (not shown) such as, for example, a computer, and a power distribution center, or a smart power grid. The electric vehicle controller 344 may communicate via an electric vehicle communication interface 384 to other systems (not shown) such as, for example, an on-board computer on the vehicle, other battery charging controller, other electronic systems within the vehicles, and remote electronic systems.

The base charging system controller 342 and electric vehicle controller 344 may include subsystems or modules for specific application with separate communication channels. These communications channels may be separate physical channels or separate logical channels. As non-limiting examples, a base charging alignment system 352 may communicate with an electric vehicle alignment system 354 through a communication link 356 to provide a feedback mechanism for more closely aligning the base system induction coil 304 and electric vehicle induction coil 316, either autonomously or with operator assistance. Similarly, a base charging guidance system 362 may communicate with an electric vehicle guidance system 364 through a guidance link 366 to provide a feedback mechanism to guide an operator in aligning the base system induction coil 304 and electric vehicle induction coil 316. In addition, there may be separate general-purpose communication links 376 (e.g., channels) supported by base charging communication system 372 and electric vehicle communication system 374 for communicating other information between the base wireless power charging system 302 and the electric vehicle charging system 314. This information may include information about electric vehicle characteristics, battery characteristics, charging status, and power capabilities of both the base wireless power charging system 302 and the electric vehicle charging system 314, as well as maintenance and diagnostic data for the electric vehicle 112. These communication channels may be separate physical communication channels such as, for example, Bluetooth, zigbee, cellular, etc.

Electric vehicle controller 344 may also include a battery management system (BMS) (not shown) that manages charge and discharge of the electric vehicle principal battery, a parking assistance system based on microwave or ultrasonic radar principles, a brake system configured to perform a semi-automatic parking operation, and a steering wheel servo system configured to assist with a largely automated parking 'park by wire' that may provide higher parking accuracy, thus reducing the need for mechanical horizontal induction coil alignment in any of the base wireless charging system 102a and the electric vehicle charging system 114. Further, electric vehicle controller 344 may be configured to communicate with electronics of the electric vehicle 112. For example, electric vehicle controller 344 may be configured to communicate with visual output devices (e.g., a dashboard display), acoustic/audio output devices (e.g., buzzer, speakers), mechanical input devices (e.g., keyboard, touch screen, and pointing devices such as joystick, trackball, etc.), and audio input devices (e.g., microphone with electronic voice recognition).

Furthermore, the wireless power transfer system 300 may include detection and sensor systems (not illustrated). For example, the wireless power transfer system 300 may include sensors for use with systems to properly guide the driver or the vehicle to the charging spot, sensors to mutually align the induction coils with the required separation/coupling, sensors to detect objects that may obstruct the electric vehicle induction coil 316 from moving to a particular height and/or position to achieve coupling, and safety sensors for use with systems to perform a reliable, damage free, and safe operation of the system. For example, a safety sensor may include a sensor for detection of presence of animals or children approaching a electric vehicle induction coils 316 beyond a safety radius, detection of metal objects near the base system induction coil 304 that may be heated up (induction heating), detection of hazardous events such as incandescent objects on the base system induction coil 304, and temperature monitoring of the base wireless power charging system 302 and electric vehicle charging system 314 components.

The wireless power transfer system 300 may also support plug-in charging via a wired connection. A wired charge port may integrate the outputs of the two different chargers prior to transferring power to or from the electric vehicle 112. Switching circuits may provide the functionality as needed to support both wireless charging and charging via a wired charge port.

To communicate between a base wireless charging system 302 and an electric vehicle charging system 314, the wireless power transfer system 300 may use both in-band signaling and an RF data modem (e.g., Ethernet over radio in an unlicensed band). The out-of-band communication may provide sufficient bandwidth for the allocation of value-add services to the vehicle user/owner. A low depth amplitude or phase modulation of the wireless power carrier may serve as an in-band signaling system with minimal interference.

In addition, some communication may be performed via the wireless power link without using specific communications antennas. For example, the wireless power induction coils 304 and 316 may also be configured to act as wireless communication transmitters. Thus, some embodiments of the base wireless power charging system 302 may include a controller (not shown) for enabling keying type protocol on the wireless power path. By keying the transmit power level (amplitude shift keying) at predefined intervals with a predefined protocol, the receiver may detect a serial communication from the transmitter. The base charging system power converter 336 may include a load sensing circuit (not shown) for detecting the presence or absence of active electric vehicle receivers in the vicinity of the near field generated by the base system induction coil 304. By way of example, a load sensing circuit monitors the current flowing to the power amplifier, which is affected by the presence or absence of active receivers in the vicinity of the near field generated by base system induction coil 104a. Detection of changes to the loading on the power amplifier may be monitored by the base charging system controller 342 for use in determining whether to enable the oscillator for transmitting energy, to communicate with an active receiver, or a combination thereof.

To enable wireless high power transfer, some embodiments may be configured to transfer power at a frequency in the range from 10-60 kHz. This low frequency coupling may allow highly efficient power conversion that may be achieved using solid state devices. In addition, there may be less coexistence issues with radio systems compared to other bands.

Figure 4:
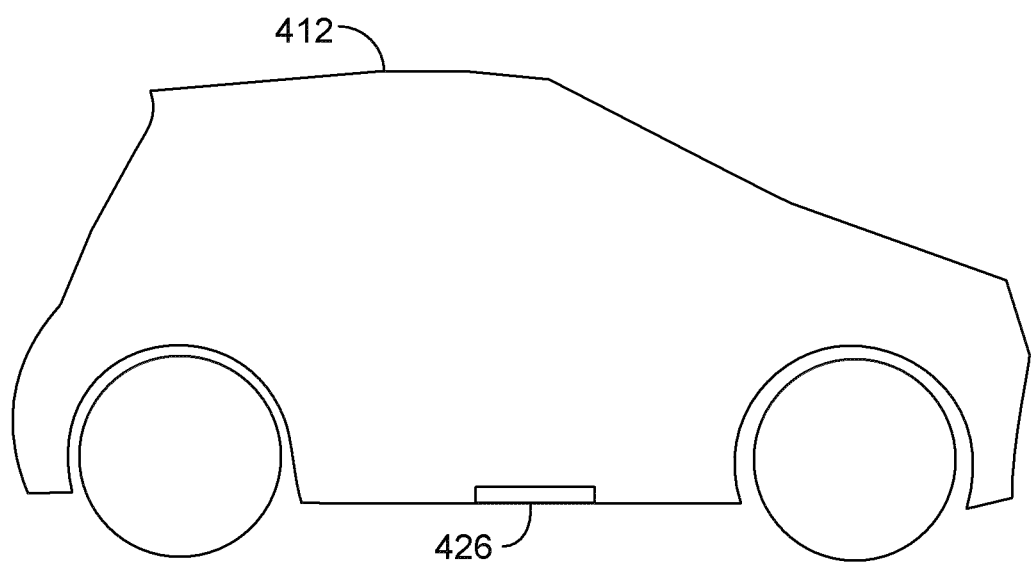
FIG. 4 illustrates an induction coil housing along a lower surface of an electric vehicle that can be utilized in the wireless power transfer system of FIG. 1, in accordance with an exemplary embodiment.

The wireless power transfer system 100 described may be used with a variety of electric vehicles 112 compatible with the wireless power transfer system 100 of FIG. 1. FIG. 4 illustrates an induction coil housing 426 disposed in an electric vehicle 412 compatible with the wireless power transfer system 100 of FIG. 1 in accordance with an exemplary embodiment. In FIG. 4, the induction coil housing 426 is disposed along with a lower surface of the electric vehicle 412. The electric vehicle induction coil may form part of a system that powers the electric vehicle including power conversion circuitry, and other control and communications functions as needed for efficient and safe wireless energy transfer between a ground-based wireless charging unit and the electric vehicle battery unit.

It may be useful for the induction coil housing 426 to be integrated flush with a lower surface of the electric vehicle 412 so that there are no protrusive parts and so that the specified ground-to-vehicle body clearance may be maintained.

In some embodiments, and with reference to FIG. 1, the base system induction coil 104a and the electric vehicle induction coil 116 may be each in a fixed position with the induction coils brought within a near-field coupling region by overall placement of the electric vehicle induction coil 116 relative to the base wireless charging system 102a. However, in order to perform energy transfer rapidly, efficiently, and safely, the distance between the base system induction coil 104a and the electric vehicle induction coil 116 may need to be reduced to improve coupling. Thus, in some embodiments, the base system induction coil 104a and/or the electric vehicle induction coil 116 may be deployable and/or moveable to bring them into better alignment.

Figure 5A:
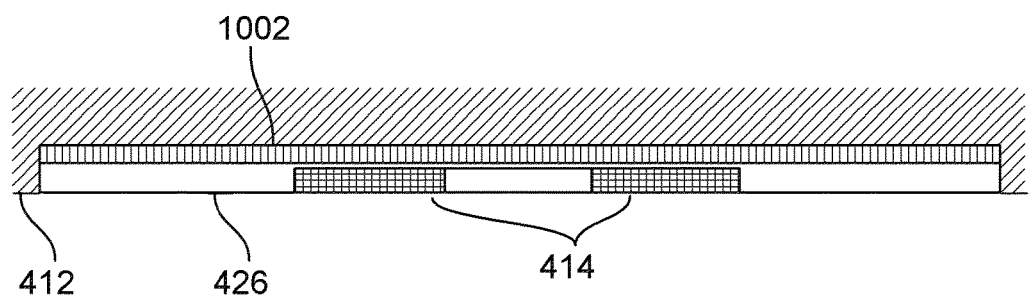
FIG. 5A illustrates a detailed view of the induction coil housing of FIG. 4 in accordance with an exemplary embodiment.

FIG. 5A illustrates a detailed view of an induction coil housing 426 flush with a lower surface of an electric vehicle 412, in accordance with exemplary embodiments. In FIG. 5A, the electric vehicle housing induction coil housing 426 can house an electric vehicle induction coil 414 and a ferrite tile assembly 1002. The ferrite tile assembly can include one or more ferrite tiles to enhance coupling and to reduce eddy currents (heat dissipation) in the induction coil housing 426.

Figure 5B:
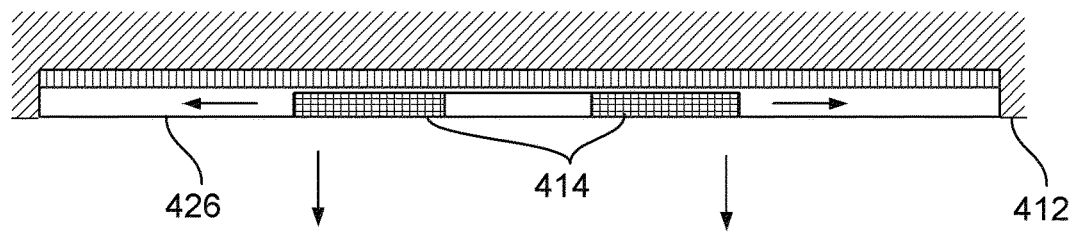
FIG. 5B illustrates an exemplary embodiment of how the electric vehicle induction coil of FIG. 5A may be movable.

FIG. 5B illustrates an embodiment where the electric vehicle induction coil 414 of FIG. 5A may be movable. The electric vehicle induction coil 414 can be moved within the induction coil housing 426 in order to better align with a base system induction coil (not illustrated in FIG. 5B). Furthermore, in certain embodiments, the induction coil housing 426 can be moved, such as but not limited to in a downward direction away from the underside of the electric vehicle 412. Although specific configurations of induction coil housing flush with the surface of an electric vehicle are discussed above, an induction coil housing not flush with a surface of an electric vehicle can also have similar properties in accordance with different embodiments. For example, an induction coil housing that is not flush with an electric vehicle can be moveable and/or include an electric vehicle induction coil that is movable.

Figure 6:
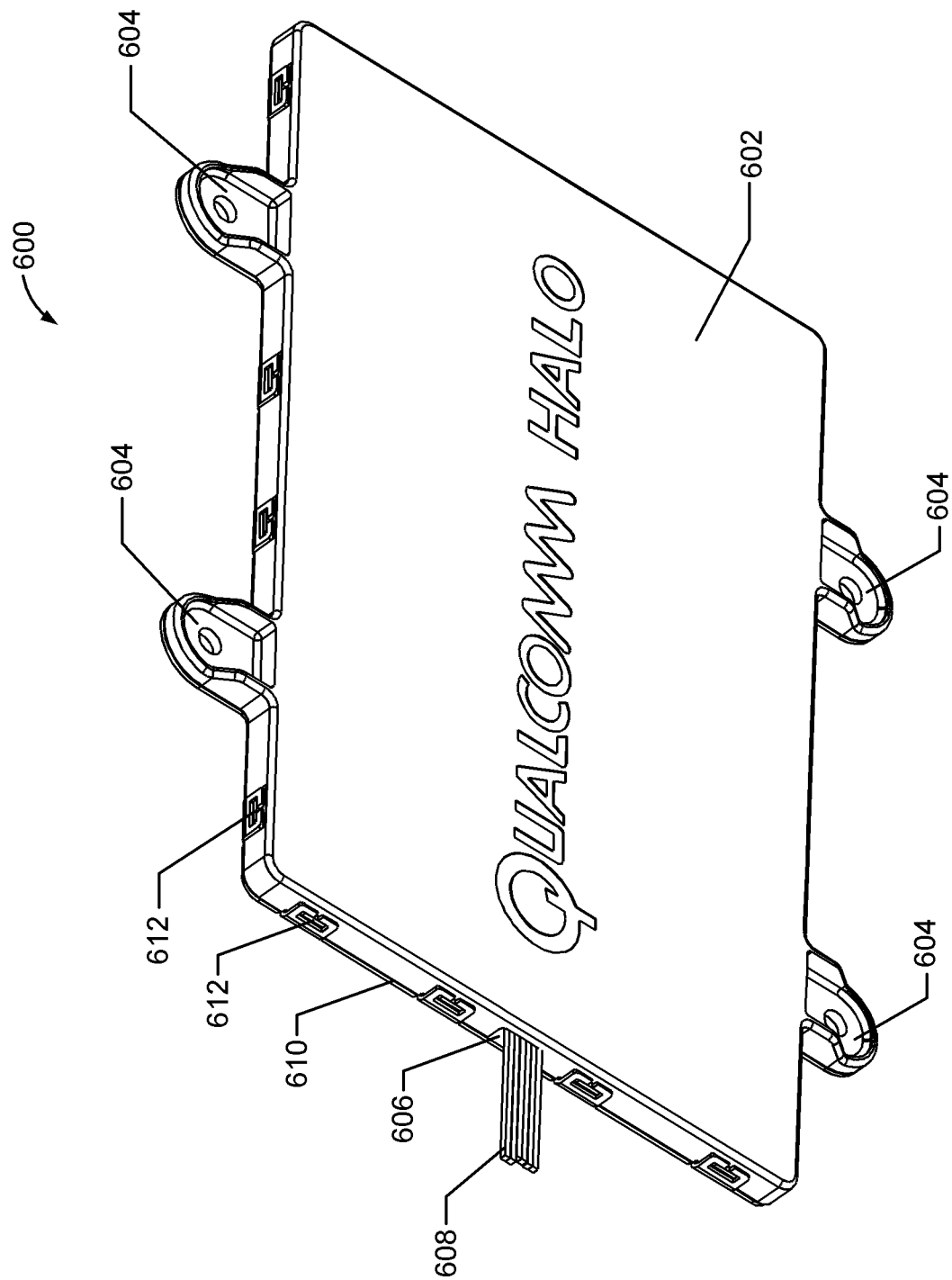
FIG. 6 illustrates a bottom perspective view of an induction coil housing for use in the wireless power transfer system of FIG. 1 in accordance with an exemplary embodiment.

A bottom perspective view of an induction coil housing 600 for use in the wireless power transfer system 100 of FIG. 1 is illustrated in FIG. 6 in accordance with an exemplary embodiment. The induction coil housing 600 can include a base 602 and a cover 610. The base 602 can form a receptacle 804 (illustrated in FIG. 8). An electric vehicle induction coil 608 can be disposed within the receptacle 804. The base 602 can include an opening 606. The opening 606 can enable an electric vehicle induction coil 608 disposed in the base 602 to interface with other components of the wireless power transfer system 100. The base 602 can also form one or more fastening ends 604. The fastening ends 604 can be used to fasten the base 602 to the electric vehicle 112. The base 612 can also form one or more locking structures 612. The locking structures 612 can be used to interface the base 602 with the cover 610.

Figure 7:
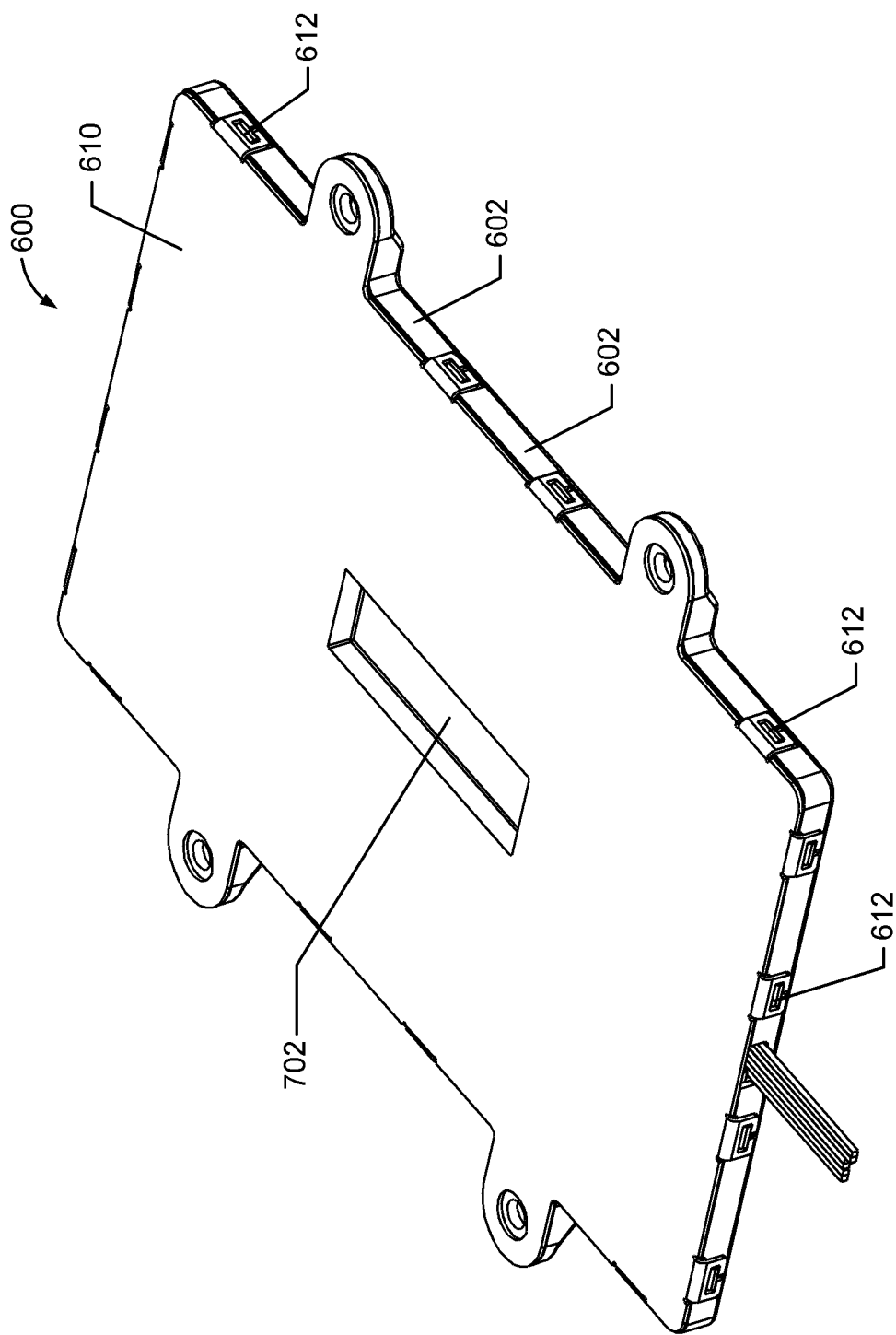
FIG. 7 illustrates a top perspective view of the induction coil housing of FIG. 6.

FIG. 7 illustrates a top perspective view of the induction coil housing 600 of FIG. 6. As illustrated in FIG. 7, the cover 610 can sit on the base 602. The cover can include a female securing structure 702. The female securing structure 702 can be configured to receive a male securing structure (not illustrated) on the surface of the electric vehicle 112.

Figure 8:
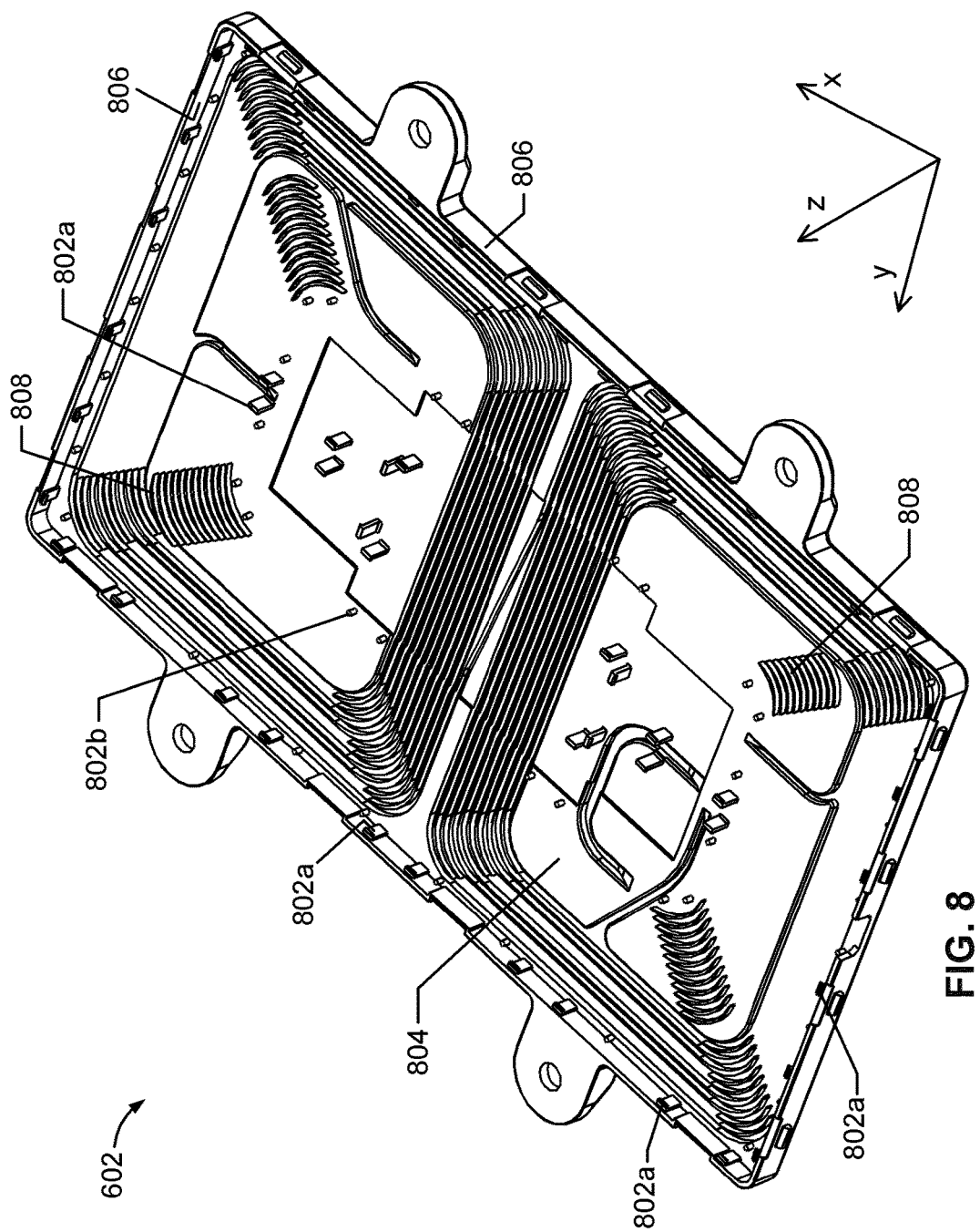
FIG. 8 is similar to FIG. 7 except that the cover, electric vehicle induction coil and ferrite tile assembly have been removed to show one or more interengagement structures.

FIG. 8 is similar to FIG. 7 except that the cover 702, electric vehicle induction coil 608 and ferrite tile 1002 assembly have been removed to show the interengagement structure. As discussed above, the base 602 can form the receptacle 804. The receptacle 804 can be an area of the base 602 within a wall 806 of the base 602. A guiding structure 808 can be formed within the receptacle 804. The guiding structure 808 can provide grooves for the electric vehicle induction coil 608 to rest against when positioned within the receptacle 804.

The interengagement structure 802(a-n) can extend from the base 602. The interengagement structure 802(a-n) can be configured to secure the ferrite tile assembly 1002 within the receptacle 804. In certain embodiments, the interengagement structure 802(a-n) can extend from the base 602 at several different locations. The term "(a-n)" is a notation that the interengagement structure 802(a-n) can be of any number or kind.

The interengagement structure 802(a-n) can encompass a clip 802a. The clip 802a can include a shaft 1104 (illustrated in greater detail in FIG. 11) that extends from the base 602. The shaft can be implemented as a member, such as (but not limited to) a longitudinal member. The clip 802a can include a tang 1102 (illustrated in greater detail in FIG. 11) at an end of the clip 802a. The tang 1102 can be configured to contact the ferrite tile assembly 1002 at an upper surface of the ferrite tile assembly 1002. In certain embodiments, the tang 1102 can secure the ferrite tile assembly 1002 along the z axis. In particular embodiments, the tang 1102 can secure the ferrite tile assembly 1002 from the cover 610. The shaft 1104 can contact a side surface of the ferrite tile assembly 1002. In certain embodiments, the shaft 1104 can secure the ferrite tile assembly 1002 along the x axis and the y axis by contacting the side surface of the ferrite tile assembly.

The interengagement structures 802(a-n) can encompass a pillar 802b. The pillar 802b can extend from the base 602. The pillar 802b can be used to space the ferrite tile assembly 1002 from the base 602. In certain embodiments, the pillar 802b can be used to space the ferrite tile assembly 1002 from the base 602 along the z axis. The pillar 802b can be configured to contact the ferrite tile assembly 1002 at the lower surface of the ferrite tile assembly 1002. The ferrite tile assembly 1002 can include an opening 1106. The opening 1106 can be on the lower surface of the ferrite tile assembly 1002. The pillar 102b can enter the opening 1106 to secure the ferrite tile assembly 1002 relative to the pillar 102b. In certain embodiments, the pillar 102b can extend from the base 602 at a different location than where the clip 802a extends from the base. In particular embodiments, the interengagement structure 802(a-n) can function as both a clip 802a and pillar 802b.

In select embodiments, the ferrite tile assembly 1002 can include a single or multiple ferrite tiles. Each ferrite tile can be supported directly or indirectly by one or more interengagement structures 802(a-n). A ferrite tile is directly supported when the ferrite tile is in contact with the interengagement structure 802(a-n). A ferrite tile is indirectly supported when the ferrite tile is in contact with one or more other ferrite tiles that are directly supported by the interengagement structure 802(a-n). By supporting each ferrite tile of the ferrite tile assembly 1002 with one or more interengagement structures 802(a-n), the ferrite tile assembly 1002 can be secured relative to the base 602. Thus, the ferrite tiles of the ferrite tile assembly 1002 need not directly contact the interengagement structure 802(a-n). In certain embodiments, at least one interengagement structure 802(a-n) contacts each ferrite tile of the ferrite tile assembly 1002. In further embodiments, four pillars 802b and one clip 802a of the interengagement structure 802(a-n) contacts each ferrite tile of the ferrite tile assembly 1002.

In specific embodiments, the interengagement structure 802(a-n) can be utilized to secure the ferrite tile assembly 1002 within the receptacle 804 of the base 602 in lieu of an epoxy 1010 present within the receptacle 804. In certain embodiments, the interengagement structure 802(a-n) can be utilized to secure the ferrite tile assembly within the receptacle 804 of the base 602 along with the epoxy 1010 present within the receptacle 804. The epoxy 1010 can be in contact with the ferrite tile assembly 1002 and the interengagement structure 802(a-n). Also, the epoxy 1010 can be in contact between individual ferrite tiles of the ferrite tile assembly 1002. In certain embodiments, the epoxy 1010 is used during a process of potting electronics within the induction coil housing 600. The epoxy 1010 can be used to pot electronics such as but not limited to the ferrite tile assembly 1002 and electric vehicle induction coil 608. In particular embodiments, securing the ferrite tile assembly within the receptacle 804 using the interengagement structure 802(a-n) can be more resilient and/or cost effective than securing the ferrite tile assembly by use of adhesives or other means prior to potting.

Figure 9:
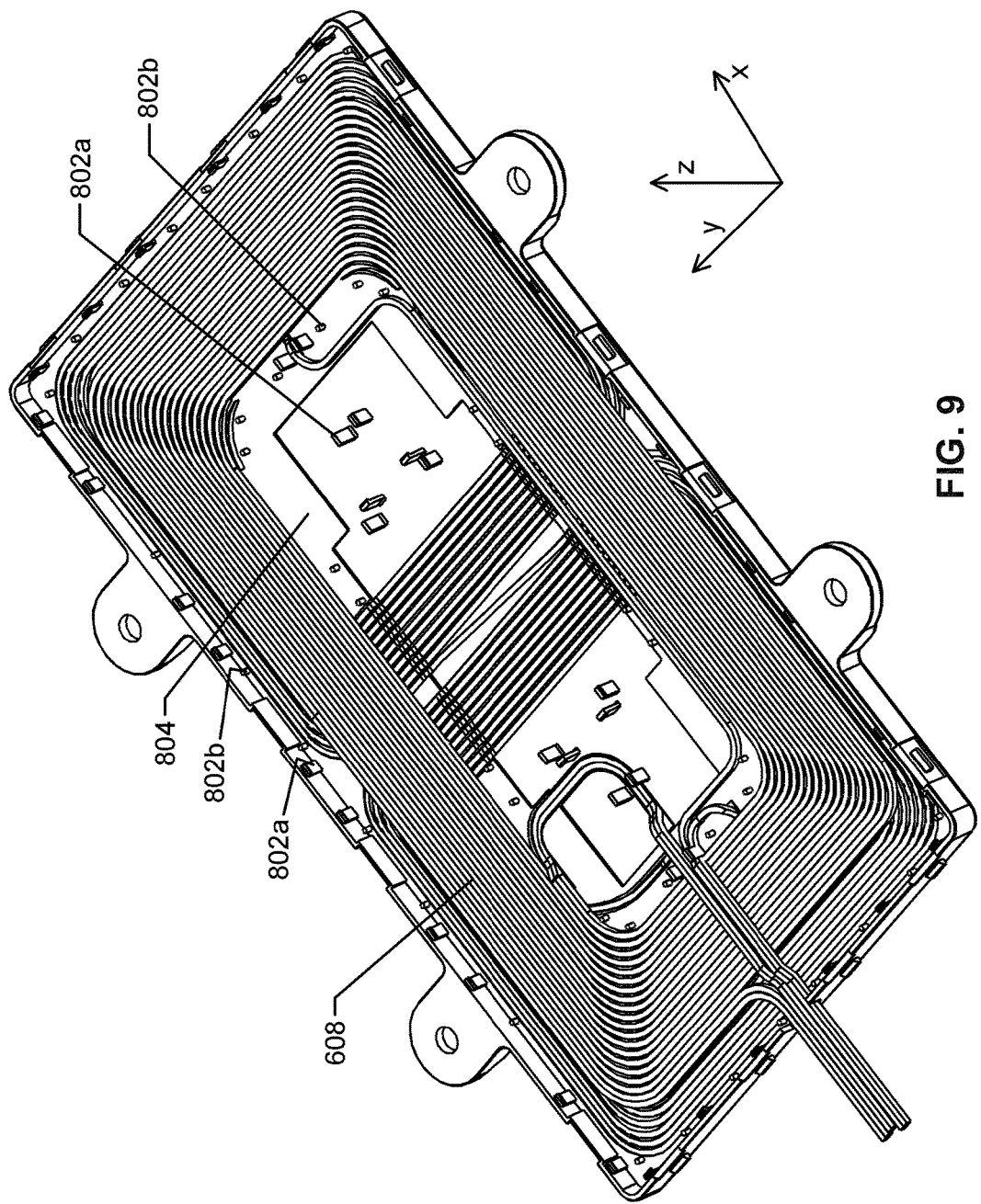
FIG. 9 is similar to FIG. 8 except with the electric vehicle induction coil in place.

FIG. 9 is similar to FIG. 8 except with the electric vehicle induction coil 608 in place. As illustrated in FIG. 9, the electric vehicle induction coil 608 can be positioned within the receptacle 804. In certain embodiments, the electric vehicle induction coil 608 can extend in the x and y axis parallel to the receptacle 804 also extending in the x and y axis.

Figure 10:
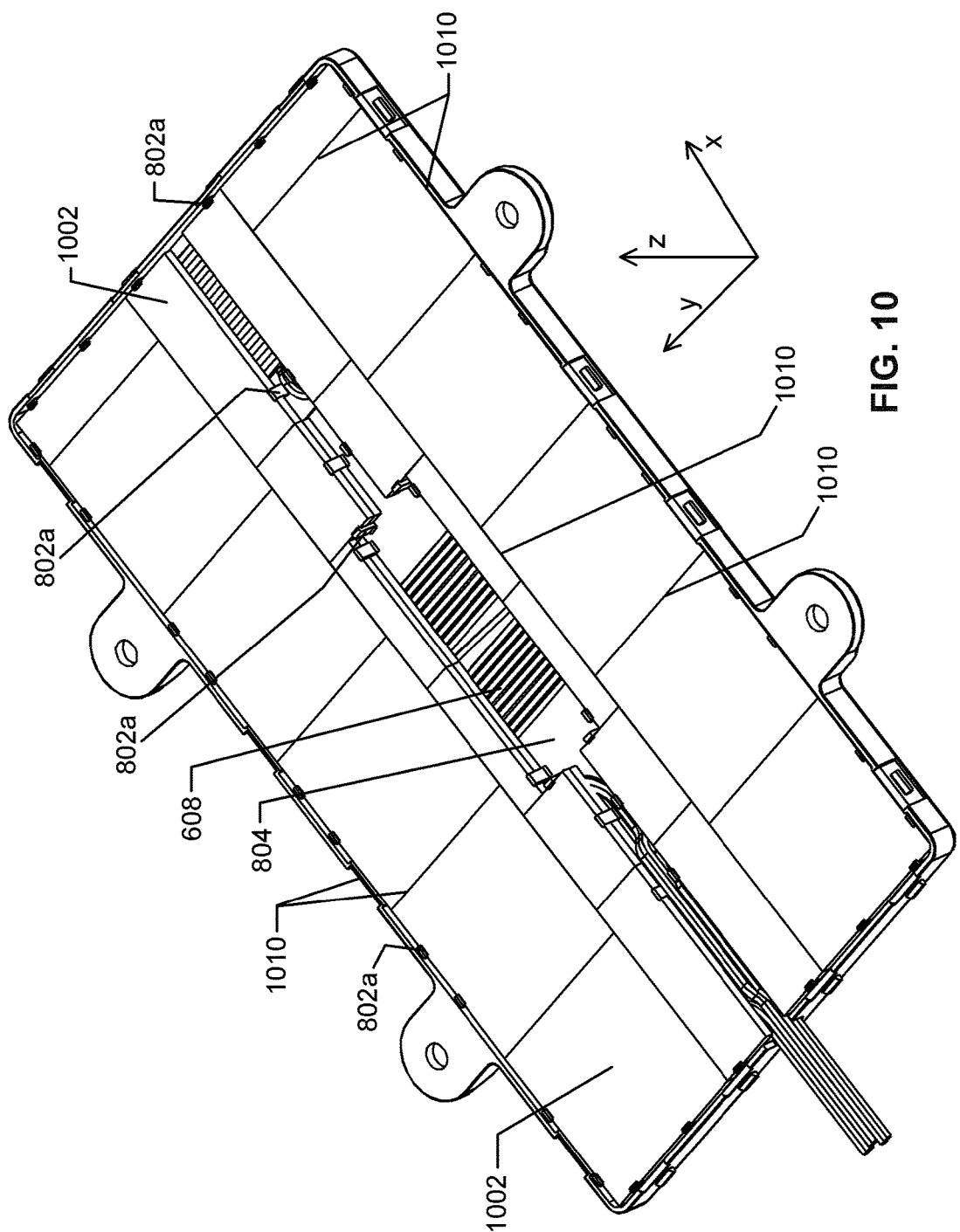
FIG. 10 is similar to FIG. 9 except with the ferrite tile assembly secured to the base by the interengagement structure.

FIG. 10 is similar to FIG. 9 except with the ferrite tile assembly 1002 secured to the base by the interengagement structure 802(a-n). As illustrated in FIG. 10, the interengagement structure 802(a-n) can extend from the base 602. The interengagement structure 802(a-n) can secure the ferrite tile assembly 1002 within the receptacle 804. Although the interengagement structure 802(a-n) includes both clips 802a and pillars 802b, only pillars 802a are illustrated in FIG. 10 due to the ferrite tile assembly 1002 obscuring the view of the pillars 802b.

Figure 11:
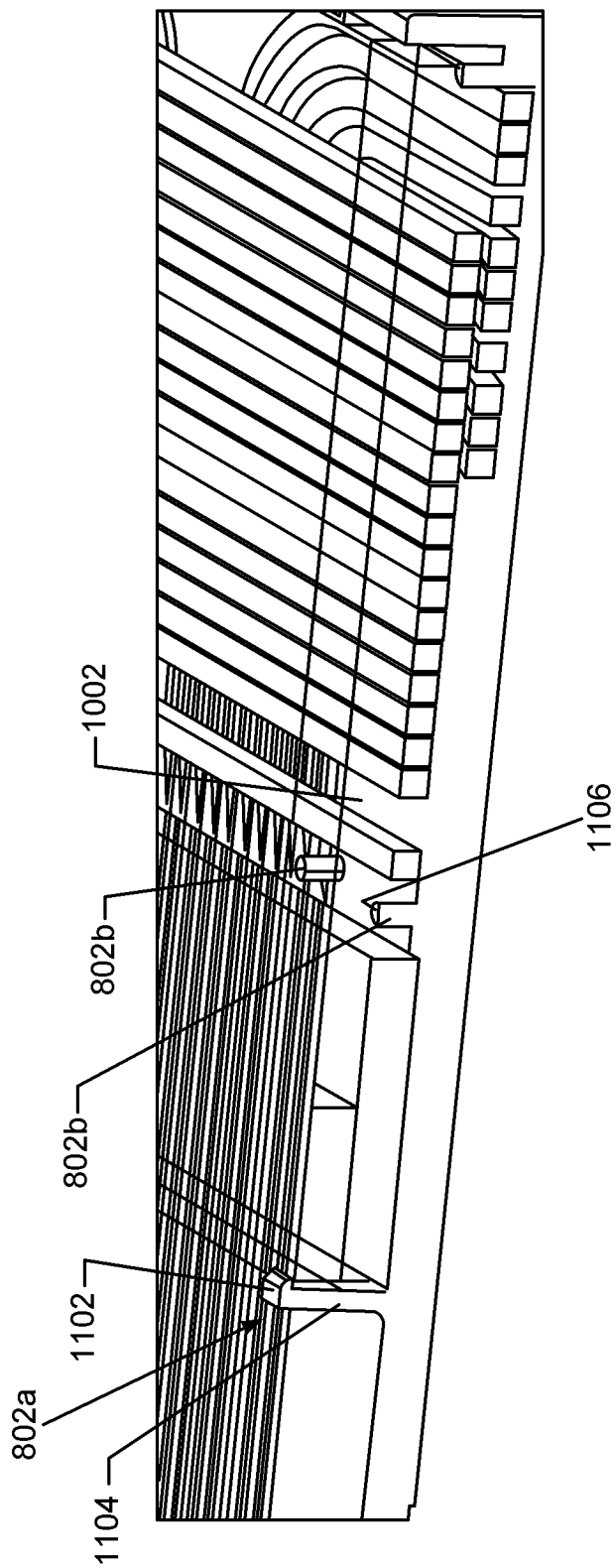
FIG. 11 illustrates a detailed view of the interengagement structure from FIG. 10 in the form of clips and pillars

FIG. 11 illustrates a detailed view of the interengagement structure 802(a-n) from FIG. 10 in the form of clips 802a and pillars 802b. As illustrated in FIG. 11, the clip 802a can include a tang 1102. The tang 1102 can be configured to contact the ferrite tile assembly 1002 at the upper and side surface of the ferrite tile assembly 1002. By contacting the ferrite tile assembly 1002 at the upper surface of the ferrite tile assembly 1002, the tang 1102 can secure the ferrite tile assembly 1002 from the cover 610. By contacting the side surface of the ferrite tile assembly 1002, the clip 802a can secure the ferrite tile assembly 1002 along the x and y axis within the receptacle 804. Also, the pillar 802b can extend from the base 602. The pillar 802b can space the ferrite tile assembly 1002 from the base 602. The pillar 802b can contact the ferrite tile assembly 1002 at a lower surface of the ferrite tile assembly 1002.

In various embodiments, the interengagement structure 802(a-n) can be implemented in a manner which secures the ferrite tile assembly 1002 by biasing the ferrite tile assembly 1002 with a degree of elasticity. In this manner, the interengagement structure 802(a-n) is pliable. Advantageously, the pliability of the interengagement structure 802(a-n) can allow the induction coil housing 600 to endure a greater range of thermal expansion, vibration and bending. The pliability of the interengagement structure 802(a-n) can also save the ferrite tile assembly 1002 from physical defects such as (but not limited to) cracking.

Figure 12:
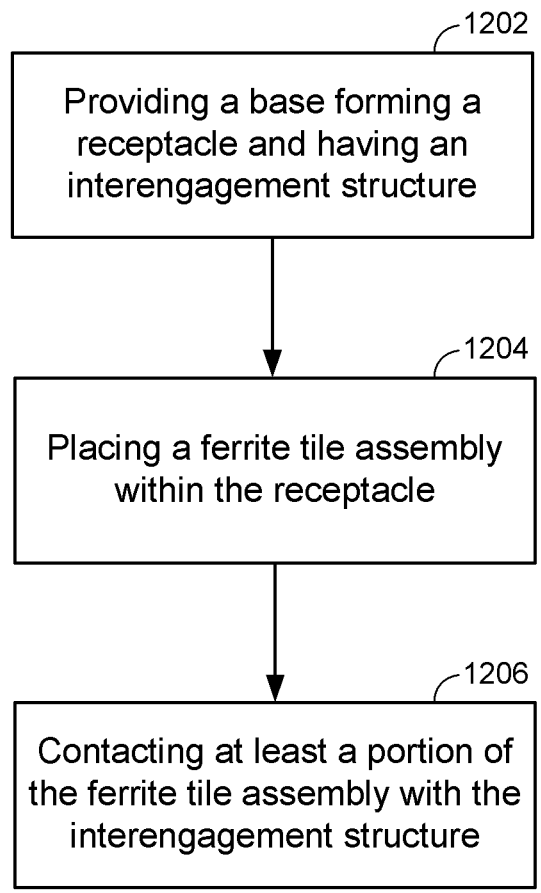
FIG. 12 illustrates a method of securing the ferrite tile assembly within the induction coil housing in the wireless power transfer system of FIG. 1 in accordance with an exemplary embodiment.

A method of securing the ferrite tile assembly 1002 within the induction coil housing 600 in the wireless power transfer system 100 of FIG. 1 is illustrated in FIG. 12 in accordance with an exemplary embodiment. Although the method in FIG. 12 is illustrated in a particular order, in certain embodiments the blocks herein may be performed in a different order or omitted, and additional blocks can be added. A person of ordinary skill in the art will appreciate that the process of the illustrated embodiment may be implemented with any housing where a ferrite tile assembly 1002 can be secured.

At block 1202, a base 602 forming a receptacle 804 and having an interengagement structure 802(a-n) can be provided. The interengagement structure 802(a-n) can extend from the base 602 within the receptacle 804.

At block 1204, the ferrite tile assembly 1002 can be placed within the receptacle 804.

At block 1206, at least a portion of the ferrite tile assembly 1002 can be put in contact with the interengagement structure 802(a-n).

Figure 13:
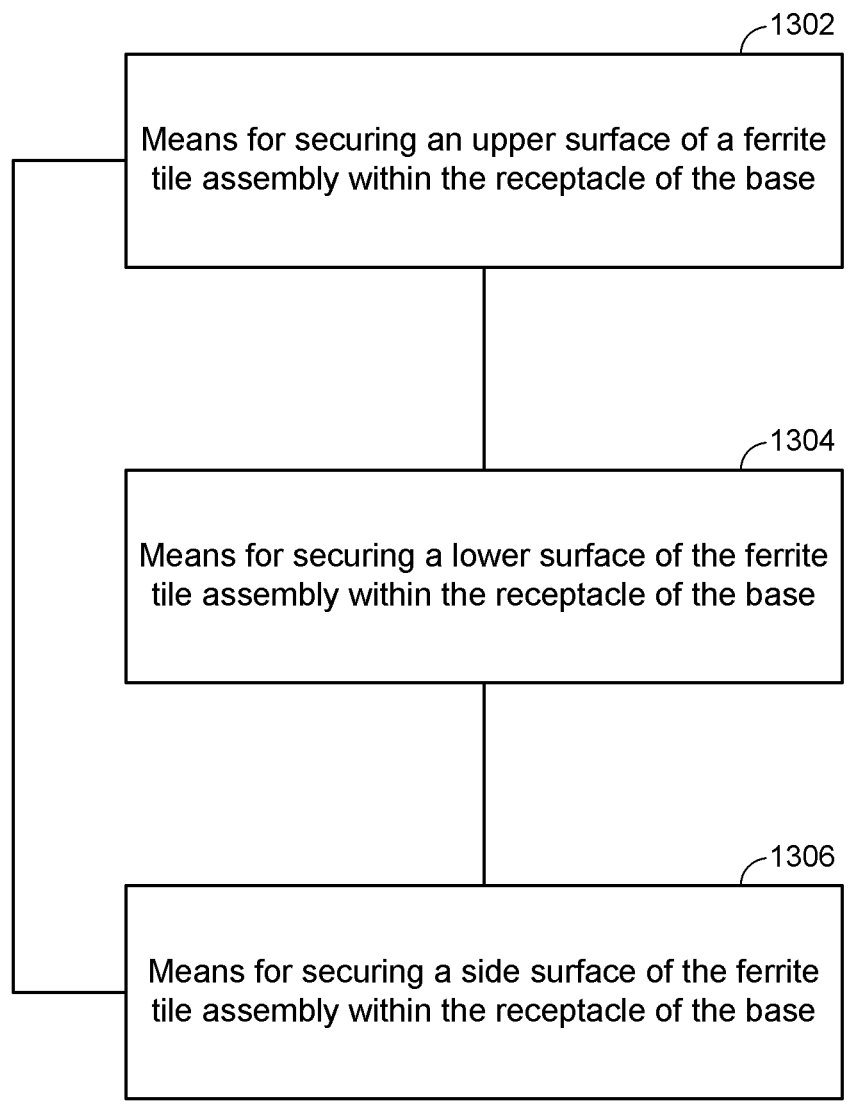
FIG. 13 is a functional block diagram of an induction coil housing in the wireless power transfer system of FIG. 1 in accordance with an exemplary embodiment.

FIG. 13 is a functional block diagram of an induction coil housing that can be employed to perform a process of FIG. 12 in the wireless power transfer system of FIG. 1. The induction coil housing can include means 1302 for securing an upper surface of the ferrite tile assembly within the receptacle of the base. In certain embodiments, the means 1302 for securing an upper surface of the ferrite tile assembly within the receptacle of the base can be configured to perform one or more of the functions with respect to block 1206 (FIG. 12). In various embodiments, the means 1302 for securing an upper surface of the ferrite tile assembly within the receptacle of the base can include a tang 1102 (FIG. 11).

The induction coil housing can further include means 1304 for securing a lower surface of the ferrite tile assembly within the receptacle of the base. In certain embodiments, the means 1304 f for securing a lower surface of the ferrite tile assembly within the receptacle of the base can be configured to perform one or more of the functions with respect to block 1206 (FIG. 12). In various embodiments, the means 1304 for securing a lower surface of the ferrite tile assembly within the receptacle of the base can include a pillar 802b (FIG. 8).

The induction coil housing can further include means 1306 for securing a side surface of the ferrite tile assembly within the receptacle of the base. In certain embodiments, the means 1306 for securing a side surface of the ferrite tile assembly within the receptacle of the base can be configured to perform one or more of the functions with respect to block 1206 (FIG. 12). In various embodiments, the means 1306 for securing a side surface of the ferrite tile assembly within the receptacle of the base can include a clip 802*a* (FIG. 8).

Although specific configurations for an induction coil housing implementing an interengagement structure to secure a ferrite tile assembly within a receptacle of a base of the induction coil housing are discussed above, an interengagement structure can be implemented in an induction coil housing to secure a ferrite tile assembly in many different ways in accordance with different embodiments.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments.

The various illustrative blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of certain embodiments have been described herein. It is to be understood that not necessarily all such advantages may be achieved in accordance with any particular embodiment. Thus, the embodiments may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the application. Thus, the present application is not intended to be limited to the embodiments shown herein but is to be accorded the widest scope consistent with the principles and novel features disclosed herein.

What is claimed is:

1. An induction coil housing comprising:
   a base forming a receptacle configured to receive a ferrite tile assembly, at least one tile of the ferrite tile assembly having an opening; and
   a pillar extending from the base and configured to be disposed in the opening so as to secure the ferrite tile assembly relative to the base within the receptacle.

2. The induction coil housing of claim 1, further comprising an epoxy, the epoxy being disposed in the receptacle.

3. The induction coil housing of claim 1, wherein the opening is disposed on a lower surface of the ferrite tile assembly.

4. The induction coil housing of claim 1, further comprising a clip, the clip having a shaft extending from the base and a tang disposed on the end of the shaft.

5. The induction coil housing of claim 4, wherein the tang is configured to contact an upper surface of the ferrite tile assembly.

6. The induction coil housing of claim 5, wherein the clip is configured to contact a side surface of the ferrite tile assembly.

7. The induction coil housing of claim 6, wherein at least one of the pillar and the tang is configured to support the ferrite tile assembly along a z axis.

8. The induction coil housing of claim 6, wherein the pillar extends from the base at a different location than where the clip extends from the base.

9. The induction coil housing of claim 1, wherein the pillar is configured to secure the ferrite tile assembly by biasing with a degree of elasticity.

10. The induction coil housing of claim 1, wherein the ferrite tile assembly comprises multiple ferrite tiles.

11. A method for securing a ferrite tile assembly within a base of an induction coil housing, the method comprising:
   providing a base forming a receptacle and having a pillar, the pillar extending from the base within the receptacle;
   placing a ferrite tile assembly within the receptacle, at least one tile of the ferrite tile assembly having an opening; and disposing the pillar within the opening so as to inhibit movement of the ferrite tile assembly in at least one direction relative to the base.

12. The method of claim 11, wherein an epoxy is disposed within the receptacle.

13. An induction coil housing comprising:
a base forming a receptacle configured to receive a ferrite tile assembly, at least one tile of the ferrite tile assembly having an opening;
means for securing an upper surface of a ferrite tile assembly within the receptacle of the base;
means for securing a lower surface of the ferrite tile assembly within the receptacle of the base, the means for securing the lower surface comprising a pillar extending from the base and configured to be disposed in the opening; and
means for securing a side surface of the ferrite tile assembly within the receptacle of the base.

14. The induction coil housing of claim 13, further comprising an epoxy, the epoxy being disposed in the receptacle.

15. The induction coil housing of claim 13, wherein the opening is on a lower surface of the ferrite tile assembly.

16. The induction coil housing of claim 15, wherein the means for securing the side surface comprises a shaft extending from the base, and wherein the means for securing the upper surface comprises a tang disposed on the end of the shaft.

17. The induction coil housing of claim 16, wherein the tang is configured to contact an upper surface of the ferrite tile assembly.

\* \* \* \* \*